United States Patent [19]

Diem et al.

[11] Patent Number: 5,510,276

[45] Date of Patent: Apr. 23, 1996

[54] PROCESS FOR PRODUCING A PRESSURE TRANSDUCER USING SILICON-ON-INSULATOR TECHNOLOGY

[75] Inventors: Bernard Diem, Echirolles; Marie-Therese Delaye, Grenoble, both of France

[73] Assignee: Commissariat A L'Energie Atomique, France

[21] Appl. No.: 167,503

[22] Filed: Dec. 15, 1993

[30] Foreign Application Priority Data

Dec. 28, 1992 [FR] France .................. 9215772

[51] Int. Cl.$^6$ .................. H01L 21/265; H01L 21/74; H01L 21/764

[52] U.S. Cl. .................. 437/24; 437/228 N; 437/26; 437/901; 437/927; 437/921; 148/DIG. 135; 148/DIG. 159

[58] Field of Search .................. 437/901, 921, 437/974, 927, 24, 228 M, 228 SEN, 26; 148/DIG. 159, DIG. 135, DIG. 73; 73/777, 718, 721, 724, 727

[56] References Cited

U.S. PATENT DOCUMENTS

| | | | |
|---|---|---|---|
| 4,262,399 | 4/1981 | Cady | 437/901 |
| 4,665,610 | 5/1987 | Barth | 148/DIG. 159 |
| 4,838,088 | 6/1989 | Murakami | 73/718 |
| 4,925,805 | 5/1990 | van Ommen et al. | 437/927 |
| 5,095,401 | 3/1992 | Zavracky et al. | |
| 5,241,864 | 9/1993 | Addie et al. | 73/718 |
| 5,258,097 | 11/1993 | Mastrangelo | 156/644 |
| 5,321,989 | 6/1994 | Zimmer et al. | 73/724 |
| 5,332,469 | 7/1994 | Mastrangelo | 437/901 |
| 5,369,544 | 11/1994 | Mastrangelo | 73/718 |

FOREIGN PATENT DOCUMENTS

| | | |
|---|---|---|
| 9102748 | 3/1991 | Germany . |
| 56-111243 | 9/1981 | Japan ................ 437/26 |
| 2198611 | 6/1988 | United Kingdom . |
| 91/12507 | 2/1991 | WIPO . |
| 9119177 | 12/1991 | WIPO . |

OTHER PUBLICATIONS

J. Electrochem. Soc., vol. 137, Nov. 1990, "Anisotropic Etching of Crystalline Silicon . . .", Seidel et al pp. 3626–3632.

IEEE Transactions of Electron Devices, vol. 36, Apr. 1989, "Study of Electrochemical Etch—stop. . ." Kloeck et al.

Transducer's 87, Tokyo Jun. 1987, "Fine Grained Polysilicon & Its Application . . .", Guckel et al, pp. 227–282.

Transducers 1991, "SURFACE MICROMACHINES MICRO–DIAPHRAGM PRESSURE SENSORS", Jun., pp. 188–191.

Silicon Based Sensors –Digest of Technical Papers, 1986 Dec., "MICROMACHINING OF SILICON BY SELECTIVE ADODISATION".

Transducers' 91 Digest of Technical Papers, "Stability & Common Mode Sensitivity . . .", Holm et al, pp. 978–981.

Technical Digest MNE'90, Berlin, Nov. 1990, pp. 81–86, "Wafer Bonding and Its Application Silicon . . . ", Harendt et al.

Primary Examiner—Brian E. Hearn
Assistant Examiner—Leon Radomsky
Attorney, Agent, or Firm—Hayes, Soloway, Hennessey, Grossman & Hage

[57] ABSTRACT

A process for producing a pressure transducer or sensor using the silicon-on-insulator method is provided. The process includes the following steps: (a) producing a monocrystalline silicon film (44) on a silicon substrate (6) at least locally separated from the latter by an insulating layer (42), (b) producing an opening (24) in the silicon film down to the insulating layer, (c) partially eliminating the insulating layer via the opening in order to form the diaphragm in the silicon film, and (d) resealing the opening (26).

13 Claims, 7 Drawing Sheets

PROCESS FOR PRODUCING A PRESSURE TRANSDUCER USING SILICON-ON-INSULATOR TECHNOLOGY

BACKGROUND OF THE INVENTION

1. Field of the Invention

The present invention relates to a process for the production of a pressure transducer or sensor using silicon on insulator technology, as well as the transducer or sensor obtained.

This transducer is usable in all fields where it is wished to measure a pressure and in particular in industrial fields such as the space and aeronautical fields, in the research field and also in connection with motor vehicles.

BRIEF DESCRIPTION OF THE PRIOR ART

Numerous methods have been proposed for producing pressure transducers or micromachined silicon mechanical structures for transducers using microelectronic technologies.

The main advantage of silicon is clearly the collective treatment of the structures and their miniaturizations, i.e. a relatively low cost, as well as the mechanical reliability of the monocrystalline material used, which does not suffer from creep, hysteresis or time drift.

However, for an even more widespread use of these transducers, it is necessary to reduce even further the unit cost of the chip by reducing its surface, whilst retaining acceptable metrological qualities.

The standard technologies for the production of pressure transducers use volume anisotropic chemical machining of silicon, i.e. the entire substrate thickness is etched in order to free a sensitive monocrystalline structure.

The major disadvantages of this volume method are the use of a double face method (few existing specific machines, which are expensive and substrates polished on two faces); a shape of the transducer linked with the crystalline orientation of the substrate and therefore a limitation of these shapes; miniaturization of the transducer limited by the thickness of the substrate (three-dimensional structure, one dimension being fixed) and the need to carry out a sealing or bonding of the transducer on one or more substrates requiring the use of structure support and reference cavities, which somewhat complicates the manufacture of the transducers.

This volume method is described in reference 1—Transducers' 91 Digest of Technical papers, San Francisco, "Stability and common mode sensitivity of piezoresistive silicon pressure sensors made by different mounting methods" by R. Holm et al, pp. 978–981.

In general terms, the basic principle used in a silicon pressure transducer is the measurement of the deformation of a deformable silicon diaphragm or membrane mechanically connected to a support under the action of a pressure variation.

In order to produce pressure transducers in accordance with a volume method, it is necessary to have a selective layer during the etching of the substrate making it possible to bring about an etch stop at a clearly controlled depth. In addition, for mechanical strength reasons and also due to the electrical characteristics, it is very important for the freed structure to be of monocrystalline silicon.

The etch stop methods used are either the etching of a solid silicon substrate by the rear face with stopping on an epitaxial or epitaxially deposited silicon layer highly doped with boron (cf. reference 2 - J. Electrochem. Soc., Vol. 137, No. 11, November 1990, "Anisotropic etching of crystalline silicon in alkaline solutions: II. Influence of dopants" by H. Seidel et al. pp. 3626–3632), or an electrochemical etching of the silicon substrate with etch stop on an epitaxial or epitaxially deposited silicon layer forming a P/N junction with the substrate (cf. reference 3—IEEE Transactions on Electron Devices, Vol. 36, No. 4, April 1989, "Study of electrochemical etch-stop for high-precision thickness control of silicon membranes" by B. Kloeck et al., pp. 663–669).

These two etch stop methods suffer from the disadvantages referred to hereinbefore. Thus, they use an anisotropic etching of the substrate, limiting the shapes of the sensitive elements as a result of the crystalline orientation of the substrate, as well as etching by the rear face requiring the use of special substrates and a double face alignment procedure.

These stop methods also require the use of very selective etching masks and, taking account of the inclined etching planes (54.7° for orientation 100 silicon) and the thickness of the silicon to be etched, the shapes produced on the rear face greatly exceed the final useful shapes of the component. The use of these very selective etching masks is in particular linked with a significant thickness of the silicon substrate to be etched.

When the sensitive element is finished, it is then necessary to bond it on one or more thick, rigid supports in order to obtain a transducer. This support or these supports generally have a different nature to the substrate (e.g. glass), which leads to differential stresses prejudicial to the performance characteristics of the transducer and also to a difficult, supplementary stage to be carried out.

Another way of producing pressure transducers consists of using a surface machining with the aid of a sacrificial layer and a deposited polycrystalline silicon layer producing the desired mechanical structure. This is described in reference 4—Transducer's 87, Tokyo, June 1987, "Fine grained polysilicon and its application to planar pressure transducers" by H. Guckel et al. pp. 277–282.

This method makes it possible to produce pressure transducers in single face technology by the use of the sacrificial layer. This surface machining has the major advantage of associating a simple method with structures having very small dimensions.

Unfortunately, this surface method suffers from disadvantages. In particular, the mechanical qualities of the material constituting the diaphragm (polycrystalline silicon or silicon nitride) are mediocre and significant differential thermal stresses are induced as a result of using different materials for the diaphragm and the substrate. This leads to pressure transducers having limited or inadequate metrological qualities.

Moreover, due to their nature, these deposits have a thickness limited to a few micrometers (generally below 2 µm), which reduces the shape and size possibilities and prevents the use of a piezoresistive detection of the pressure.

In order to obviate these different disadvantages, the invention proposes a novel process for the production of a pressure transducer using silicon on insulator technology combined with a micromachining of the surface.

Silicon on insulator technology is known under the abbreviation SOI. One of the known methods makes use of recrystallization by laser of an amorphous or polycrystalline silicon layer deposited on a silicon dioxide layer obtained by the thermal oxidation of a monocrystalline silicon substrate. A second method known under the abbreviation SDB consists of carrying out the bonding of the two silicon substrates, whereof at least one has on the bonding surface a $SiO_2$ layer, e.g. obtained by thermal oxidation, followed by the thickness reduction of one of the two substrates until the desired thickness is obtained (cf. Technical Digest MNE'90, 2nd Workshop, Berlin, November 90, pp. 81–86 by C. Harendt et al. "Wafer bonding and its application silicon-on-insulator fabrication".

A third known method is based on the implantation of oxygen or nitrogen ions with a high dose in solid monocrystalline silicon which, following annealing of the substrate at a high temperature, leads to the formation of a buried silicon oxide or silicon nitride insulating layer supporting a monocrystalline silicon film. The oxygen ion implantation technology is known as SIMOX technology. The invention makes more particular use of the third method.

W091/19177 also describes a transducer having a deformable diaphragm and which can function by the capacitive effect. Thus, electrodes are formed on the substrate prior to producing the silicon and insulating layers, in the form of a p/n junction. However, such a process is not compatible with the SIMOX technology used in the present invention. SIMOX technology makes it necessary to heat the device to a high temperature close to 1350° C. for about 6 hours in order to form the insulating layer and to restore the crystalline quality deteriorated during implantation. Under these conditions, any prior production by doping, such as the formation of an insulated electrode, with the aid of a p/n junction, is destroyed or deteriorated by the diffusion of species.

SUMMARY OF THE INVENTION

The process according to the invention makes it possible to obtain mechanical monocrystalline silicon structures and therefore good metrological characteristics, which have very small dimensions and therefore a high density, so that the production costs are reduced. This process also makes it possible to produce pressure transducers which can be auto-tested for calibration with a capacitive or piezoresistive detection.

The process according to the invention also permits the monolithic and collective production of microtransducers, with complete freedom with regards to the shape of the structure, using a single face technology and standard silicon substrates, polished on one face and having a standard thickness with very small overall dimensions.

This process also obviates the critical stage of bonding the transducer to a support of a different nature, as well as an integration of integrated circuits for the detection of deformations of the diaphragm. In particular, this technology is compatible with CMOS technology.

Finally, the process according to the invention makes it possible to obtain transducers having a very low cost.

More specifically, the present invention relates to a process for the production of an integrated pressure transducer having at least one deformable diaphgram integral with a substrate and means for measuring the deformations of this diaphragm, characterized in that it comprises the following stages:

a) implantation of oxygen ions in a monocrystalline silicon substrate and annealing the substrate in order to form a monocrystalline silicon film on the substrate and separated from the latter, at least locally, by an insulating layer, b) producing an opening in the silicon film down to the insulating layer, c) partial elimination of the insulating layer via the said opening in order to form the diaphragm in the silicon film, d) resealing said opening, said process also having a stage of producing at least one buried electrode in the silicon substrate facing the deformable diaphragm, said stage taking place following the annealing of the substrate.

The means for detecting displacements of the diaphragm may or may not be integrated into the sensitive structure. When these means are integrated they are produced on the surface of the silicon film. In this case, the silicon film is advantageously conductive and there must be a supplementary stage for producing electric contacts on said film.

These detection means are of the electric or electronic type. These means can consist of variable capacitance capacitors, strain gauges or inductive devices. The electric signals supplied by these different detection means are proportional to the deformations of the diaphragm, which are themselves proportional to the pressure exerted on the transducer.

The insulating layer is advantageously isotropically etched in order to obtain perfectly circular shapes, defining the final shape of the structure and independently of the crystalline orientation of the silicon of the film and the substrate.

Advantageously, the process according to the invention involves a supplementary stage of depositing by epitaxy a conductive monocrystalline silicon layer prior to the formation of the opening, with a view to making the diaphragm thicker and thus ensuring its rigidity.

The epitaxial or epitaxially deposited silicon must also be doped in order to ensure an adequate electrical conductivity of the diaphragm and therefore a good detection of possible deformation of the diaphragm by the integrated detection means.

The process according to the invention is more particularly applicable to the aforementioned SIMOX method.

The implantation of ions can take place one or more times, each implantation being followed by the annealing of the structure.

The silicon film and optionally the substrate when the latter forms the basis for the production of the surface film can have a P conductivity. However, it is preferable to use an N conductivity.

The resealing of the opening in the silicon film is obtained by depositing on the complete structure at least one material layer which can be selectively etched with respect to the silicon and by etching said layer so as to only retain material at the location of the openings.

The resealing of the opening in the film also makes it possible to form at this location a stud or block which bears on the substrate and which forms a shim contributing to the rigidity of the diaphragm.

Advantageously resealing is carried out by an insulating material, which can be constituted by silicon dioxide, silicon nitride, silicon oxynitride or preferably a stack of silicon dioxide and silicon nitride. However, the resealing material can also be conductive, particularly in the case of a piezoresistive detection.

The process according to the invention is advantageously used in the production of a pressure transducer having capacitive measuring means. In this case, the process of the invention has a supplementary stage of producing at least one buried electrode in the silicon substrate facing the diaphragm.

The production of the buried electrode constitutes a preferred embodiment of the invention.

However, it is possible to use the conductive substrate as the first plate of a capacitor, the second plate being formed by the conductive silicon film.

This buried electrode can be formed by locally implanting ions in the substrate having a conductivity which is the reverse of that of the substrate. Thus, for a type N substrate an implantation of P type ions takes place, so as to form a P/N junction.

For a transducer having capacitive measuring means, the insulating layer is advantageously formed over the entire substrate surface.

In order to obtain freedom from thermal or time drifts of the transducer, it is possible to, use a capacitive differential measurement by producing a reference structure which is not sensitive to pressure and which is similar to the sensitive structure of the transducer. Thus, said reference structure has a rigid diaphragm and is produced simultaneously on the silicon substrate of the sensitive structure.

In this case, the process according to the invention advantageously has the following stages:

producing the conductive silicon film separated from the substrate over its entire surface, producing several openings in the silicon film down to the insulating layer, partial elimination of the insulating layer via at least one of the said openings, resealing said openings by insulating studs, producing electric contacts on the conductive silicon.

The studs or blocks ensure a significant rigidity on the part of the diaphragm of the reference structure, which therefore loses all sensitivity to pressure.

Advantageously, in the film a first opening is formed down to the insulating layer, with a partial elimination of the insulating layer via the first opening, whilst second openings are made in the silicon film.

Preferably, at least one buried reference electrode is made in the silicon substrate facing the rigid diaphragm.

The flexibility with respect to the lateral dimensions of the deformable diaphragm and the rigid diaphragm, as well as with regards to the thickness makes it possible to have a very wide pressure measurement range.

According to a variant of the invention, a differential capacitive measurement can also take place without any additional, non-sensitive reference structure. To this end, the sensitive structure is equipped with two types of electrodes. On the one hand one or more so-called useful electrodes are placed on the substrate and face large deformation regions of the diaphragm and on the other one or more so-called reference electrodes are placed on the substrate and face very small deformation regions of the diaphragm. The high deformation regions are spaced from the diaphragm periphery and from the central stud. The low deformation regions are in the vicinity of said parts which contribute to the stiffening of the diaphragm. Thus, the non-homogeneity of the diaphragm is utilized in order to create two types of capacitances, designated respectively useful capacitance and reference capacitance. By differential measurement between the useful and reference capacitances, the parasitic effect due to temperature or mechanical fatigue of the diaphragm are eliminated.

The invention is also applicable to the production of a pressure transducer having piezoresistive measuring means. In this case, the process according to the invention comprises the following stages: local doping of the deformable diaphragm by ions having the reverse conductivity to that of the silicon film in order to form there at least one strain gauge and electrical insulation of the gauge and electrical contacting on said gauge.

The invention also relates to an integrated pressure transducer obtained by the process described hereinbefore.

BRIEF DESCRIPTION OF THE DRAWINGS

Other features and advantages of the invention can be gathered from the following non-limitative, illustrative description with reference to the attached drawings, wherein show.

DETAILED DESCRIPTION OF PREFERRED EMBODIMENTS

The following description will be made using the SIMOX method, as well as a type N monocrystalline substrate but, as stated hereinbefore, other silicon on insulator methods can be used, as can a P type substrate.

1) Pressure transducer with capacitive detection

Figure 1:
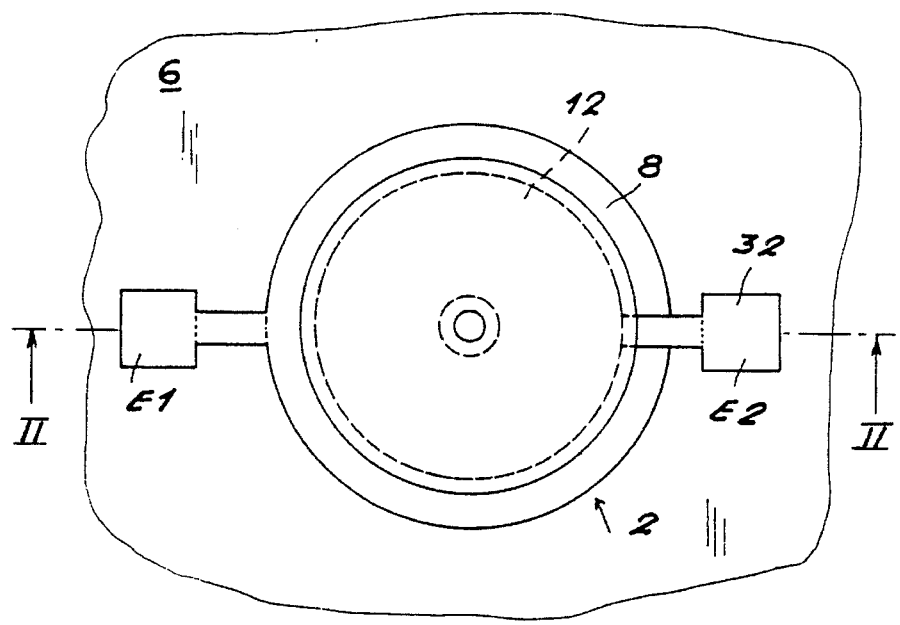
FIG. 1 illustrates diagrammatically and in plan view the sensitive structure of a pressure transducer according to the invention having capacitive detection.
Figure 2:
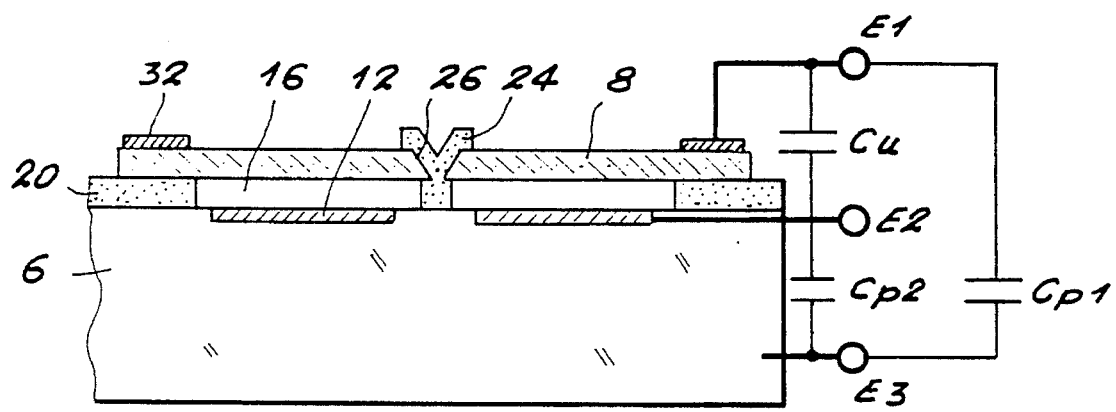
FIG. 2 is a sectional view in direction II—II of FIG. 1.
Figure 3:
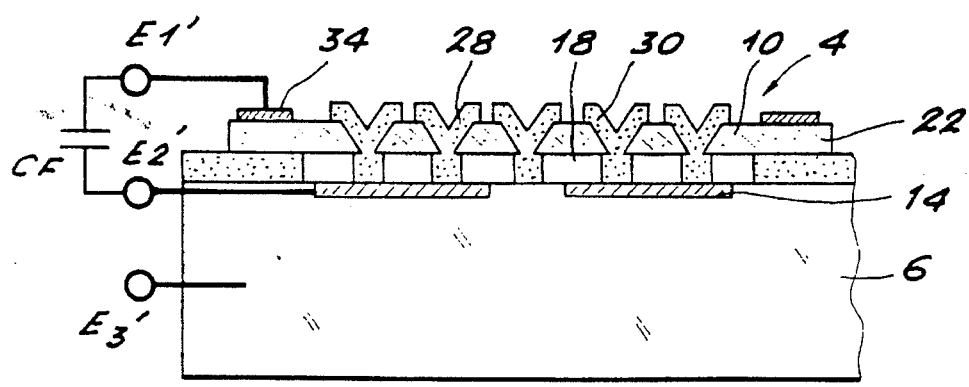
FIG. 3 is a sectional view of the reference structure of the transducer of FIG. 1.

The transducer shown in FIGS. 1 to 3 comprises a sensitive part 2 and a reference part 4 produced on the same N doped monocrystalline silicon substrate 6 and provided respectively with a deformable diaphragm 8 and a rigid diaphragm 10 also made from N or P doped monocrystalline silicon.

In plan view (FIG. 1), the deformable and rigid diaphragms have a circular shape with a diameter of approximately 25 μm to 1 mm.

As a result of the electrical conductivity of the diaphragms 8 and 10, each of the latter define with the substrate 6 a capacitor of capacitance Cu for the sensitive structure 2, whose dielectric is constituted by the vacuum space respectively 16 and 18 separating the diaphragms from the substrate. Cp1 is the parasitic capacitance of the deformable diaphragm.

The deformable and reference structures also have in each case an electrode contact layer respectively 12 and 14 buried in the substrate 6. These electrodes are also circular. They are obtained by implanting P type ions for a N type substrate in order to form a P/N junction.

The quality of this junction is not critical, because it acts as a parasitic capacitance Cp2 with respect to the substrate 6. These electrodes are preferred, but not necessary, due to the electrical conductivity of the substrate 6.

The mechanical connection between the substrate and the diaphragms is provided by an insulating ring respectively 20 and 22 formed on the periphery of the diaphragms respectively 8 and 10. These rings also electrically insulate the diaphragms against the substrate.

The insulating rings 20 and 22 are made from silicon dioxide. This electrical insulation is completed by a peripheral etching of the diaphragms 8 and 10 breaking the electrical continuity and reducing the parasitic capacitances.

In order to ensure a certain rigidity of the deformable diaphragm 8, a cylindrical insulating stud or block 24 is provided in the center of the structure. This stud serves as a plug 24 for an opening 26 traversing the diaphragm 8 and bearing on the structure 6.

In parallel, the reference structure 4 has several insulating studs or blocks 28, namely 5 in FIG. 3 and which are cylindrical, so as to ensure a high rigidity of the diaphragm 10 and therefore the pressure insensitivity thereof. These studs 28 traverse the diaphragm by means of openings 30 and then bear on the substrate 6.

Metal contacts respectively 32 and 34 are formed on the surface respectively of the diaphragms 8 and 10 to which are connected electrical connections respectively E1 and E'1. In the same way, electric contacts respectively E2, E'2 and E3, E'3 are provided on the buried electrodes 12,14 and the substrate. These electrical connections are used for connecting the sensitive and reference structures 2,4 respectively to a known processing circuit (in particular capacitance meter).

The useful capacitor of variable capacitance Cu is thus defined by the overlap of the electrodes 12 and 8. In the same way, the capacitor of fixed capacitance CF for the differential measurement is defined by the overlap of the electrode contact layers 14 and the electrode 10.

The insulating studs 24 and 30 are made from a silicon dioxide/ silicon nitride material. In addition, the metallizations 32 and 34 are made from aluminium.

According to the invention, it is possible to combine several deformable diaphragms 8. Thus, the miniaturization of the diaphragms 8 makes it possible to bring about a high unitary capacitance Cu (>10 pF/mm$^2$) and an interesting redundancy for the efficiency by a parallel coupling thereof. The reference structure permits a differential measurement so that freedom from thermal and time drifts is obtained.

Figure 4:
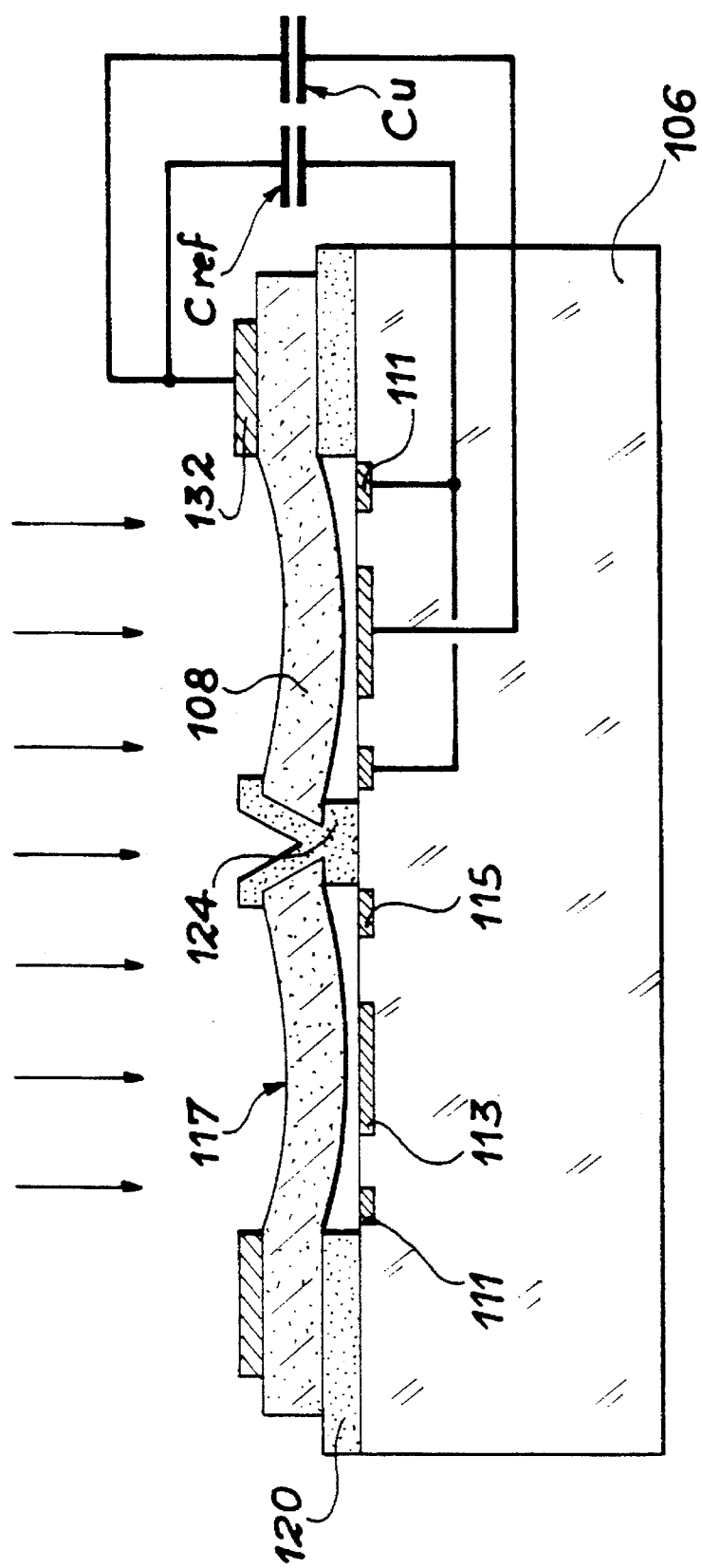
FIG. 4 is a sectional view on a larger scale of a variant of the sensitive structure according to the invention.

A variant of the invention, also adapted to a differential measurement, but only having one deformable structure 102 is illustrated in FIG. 4. In the same way as the sensitive structure of FIG. 2, this has a substrate 106, a diaphragm 108 and one or more contacts 132. The circular diaphragm 108 is mechanically connected to the substrate 106 by an insulating ring 120 and by a central insulating stud 124. This stud also performs a plug function, bears on the substrate 106 and contributes to the rigidity of the diaphragm 108. In said substrate 106 are installed three annular electrodes 111,113 and 115. The so-called reference electrodes 111 and 115 are respectively placed in the vicinity of the ring 120 and the stud 124, i.e. in the limited deformation regions of the diaphragm 108. However, the electrode 113 is remote from the ring 120 and the stud 124, in a high deformation region 117 of the diaphragm 108.

The electrodes 111 and 115 on the one hand and the electrode 113 on the other respectively form with the diaphragm 108 a reference capacitance $C_{ref}$ and a useful capacitance $C_u$. The pressure exerted under the effect of the pressure on the diaphragm is indicated by the arrows. The air gap variation in the regions of the electrodes 111 and 115 is very small.

However, in the region 117, i.e. in the region of the electrode 115, the air gap variation is high. The useful and reference capacitances are formed under the same diaphragm, so that there is no offset during a differential measurement.

The following description relates to the manufacture of the transducer or sensor shown in FIGS. 1 to 3 and relates to the simultaneous production of the sensitive structure 2 and the reference structure 4.

Figure 5:
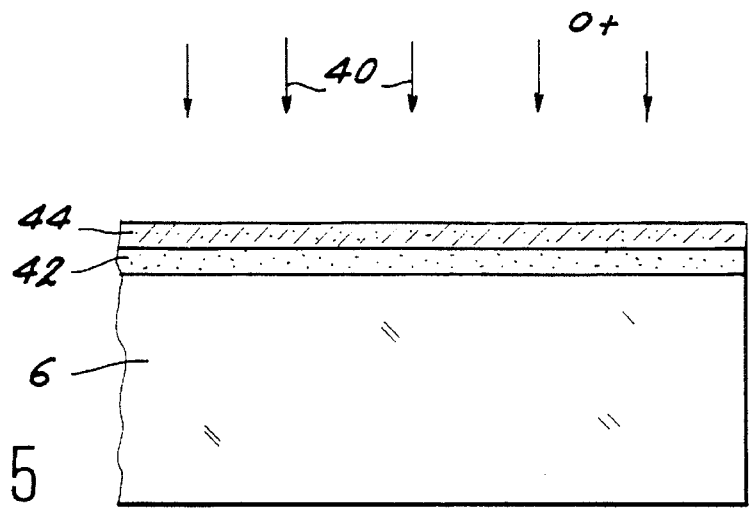
FIGS. 5 to 8,9A,9B,10A and 10B illustrate diagrammatically the different production stages according to the invention of the transducer of FIGS. 1 to 3, FIGS. 9A and 10A relating to the sensitive structure and FIGS. 9B and 10B to the reference structure.

The first stage of the process shown in FIG. 5 consists of forming a silicon on insulator type stack on the substrate 6. To this end, implantation takes place of oxygen ions 40 (0+ or O$_2$+) in the N doped monocrystalline substrate 6 of random orientation (100, 110, 101) at a dose of $10^{16}$ to $10^{18}$ ions/cm$^2$, followed by the annealing of the implanted structure at a temperature from 1150° to 1400° C. This oxygen implantation and this annealing can be repeated several times. The implantation energy is between 100 and 1000 KeV.

This mono-or multi-implantation followed by annealing makes it possible to obtain a homogeneous, buried silicon dioxide layer 42 over the entire surface of the substrate 6 and a N monocrystalline silicon surface layer 44.

For example, the thickness of the SiO$_2$ layer 42 is approximately 400 nm and that of the silicon surface layer 44 approximately 230 nm using three oxygen implantations at a dose of $10^{18}$ ions/ cm and an energy of 200 KeV.

This SIMOX method makes it possible to obtain a monocrystalline silicon layer 11 having a perfectly controllable and reproducible thickness to within 5 nm.

The subsequent partial elimination of the oxide 42 will make it possible to free the diaphragms 8 and 10 from the substrate 6 and to produce perfectly controlled, narrow spaces 16 and 18, thus making it possible to obtain a high capacitance Cu and CF.

A supplementary advantage linked with the space 16 is the possibility of using the bottom of this space and therefore the surface of the substrate 6 as a mechanical abutment in the case of an overload.

The variant shown in FIG. 4 involves stages identical to the transducer production stages of FIGS. 1 to 3.

In the remainder of the description, reference will only be made to the production stages of the reference structure when they are specific and/or different from those of the sensitive structure.

Figure 6:
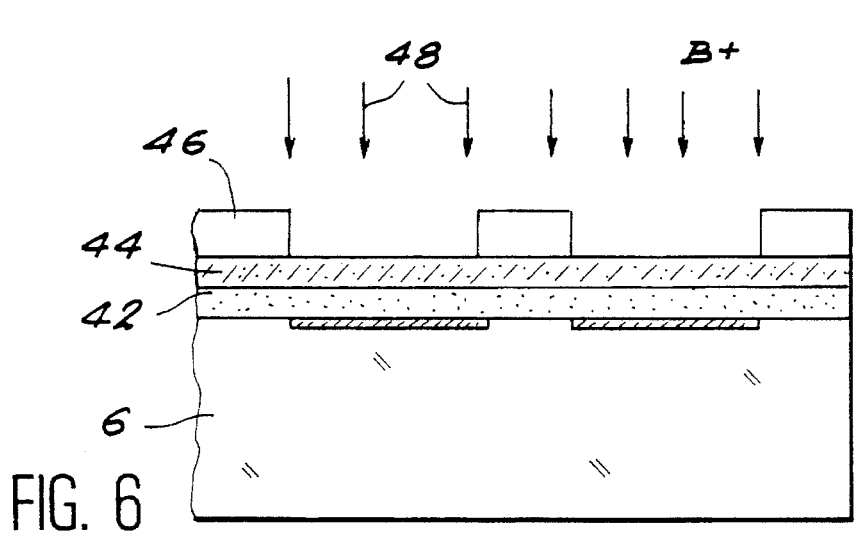

The following stage of the process shown in FIG. 6 relates to the production of buried electrodes in the substrate. For this purpose formation takes place of a mask 46 on the silicon film 44 using conventional photolithography processes, fixing the shape and location of the buried electrodes to be produced, as well as the buried electrical connection E2, E'2 of said electrodes, inter alia permitting the application of a voltage to said buried electrodes.

Through the mask 46, a deep, high energy boron implantation 48 takes place under the buried oxide ! layer 44. The implantation conditions can e.g. be a dose of 5×10$^{14}$ At/cm$^2$ at an energy of 240 keV in order to obtain a P type doped zone with a good electrical conductivity and a thickness of approximately 0.3 μm just below the buried layer 44 and this takes place in the zone not masked by the resin 46. The mask 46 will be sufficiently thick to block the implantation on the undesired zones.

It is e.g. possible to have a photosensitive resin thickness of 2 μm. Once this implantation has taken place, the mask 46 is removed e.g. by chemical etching.

Figure 7:
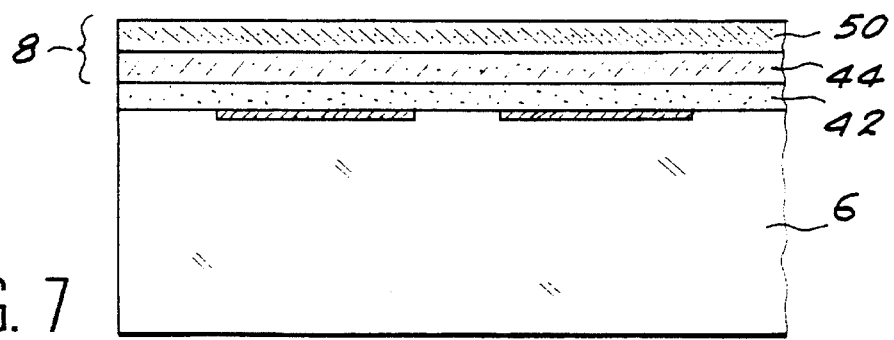

The following stage of the process shown in FIG. 7 consists of epitaxially depositing on the complete structure a P doped monocrystalline silicon layer 50 over a thickness of 1 to 100 μm as a function of the sensitivity desired for the transducer (typically 10 to 20 μm) and which serves to rigidify the structure and in particular the diaphragms 8 and 10. This epitaxial deposition is performed in the vapor phase. The thickness of the layer 50 is a function of the sensitivity desired for the pressure transducer.

Figure 8:
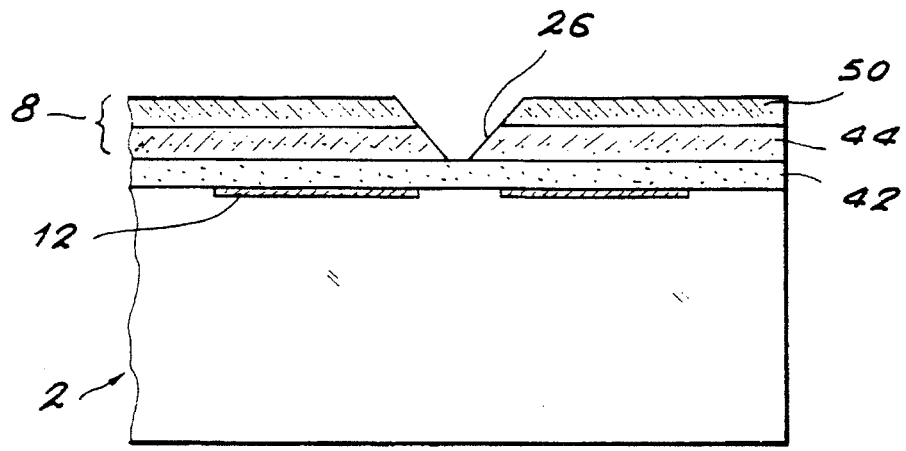
Figure 9:
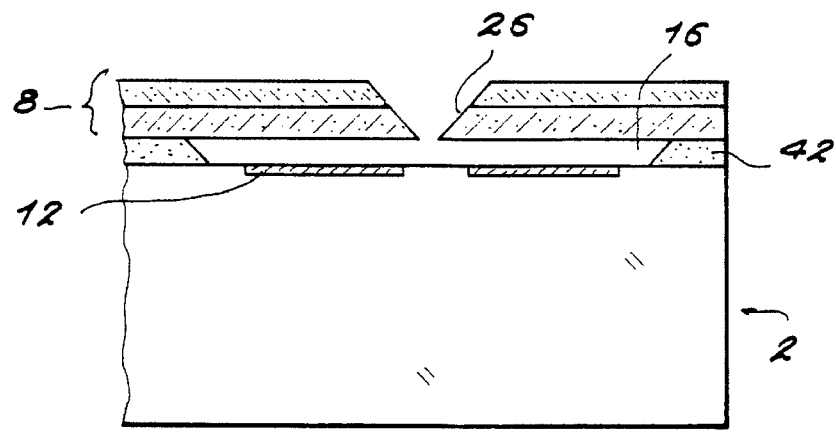
Figure 9:
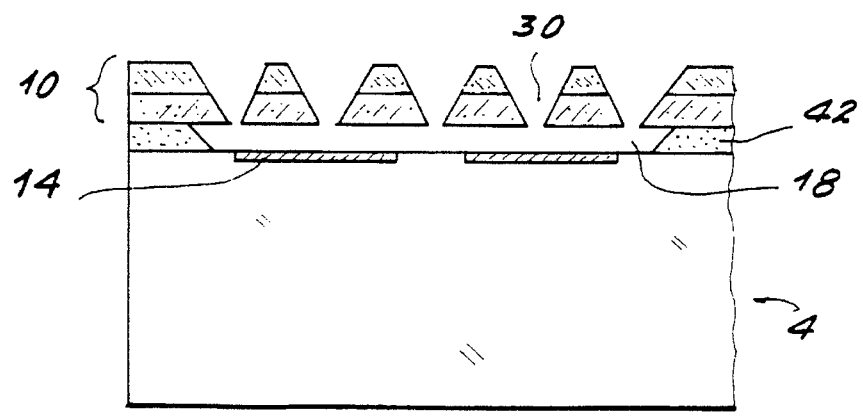

The following stage of the process shown in FIG. 8 consists of producing the opening 26 in the sensitive structure 2 and the reference structure 4 (cf. FIG. 9B) using conventional photolithography processes. These openings are produced over the entire thickness of the surface silicon and down to the oxide 42, which serves as an etch stop layer.

The etching of the silicon can be an isotropic chemical etching or a dry reactive ionic etching, so as to produce a sloping etching edge for the openings 26, which are circular. Use is e.g. made of a solution of $HF+HNO_3+CH_3COOH$ for forming the openings 26.

The following stage of the process shown in FIGS. 9A and 9B consists of freeing the diaphragms 8 and 10 respectively from the sensitive 2 and reference 4 structures by etching the sacrificial oxide layer 42 in a solution based on hydrofluoric acid and as from the openings 26. This etching is concentrically propagated beneath the silicon as a result of its isotropic nature, so that circular spaces 16 and 18 are formed and the oxide is maintained at the periphery of the structures 2 and 4.

The lateral etching speed is perfectly reproducible and is approximately 1 μm/min at ambient temperature, which permits a precise dimensional control of the lateral thickness of the insulating rings 20 and 22 (FIGS. 2 and 3) as a function of time. Once the necessary etching time has elapsed, the sample is rinsed and dried, the thin diaphragms 8 and 10 then being finished.

The following stage consists of producing the openings 30 in the diaphragm 10 of the reference structure 4 under the same conditions as for the openings 26.

Figure 10A:
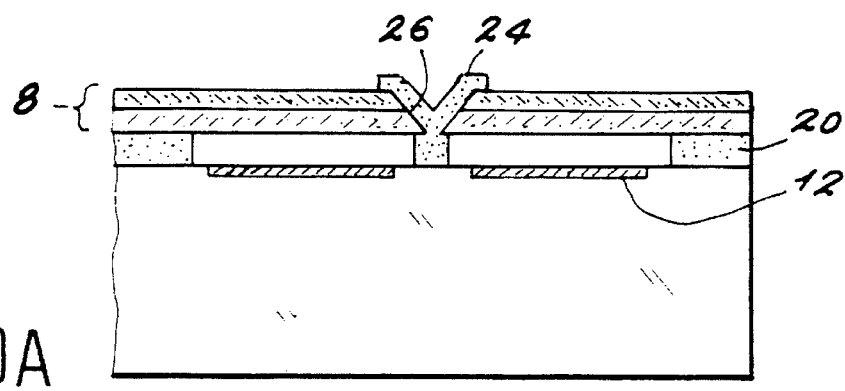
Figure 10B:
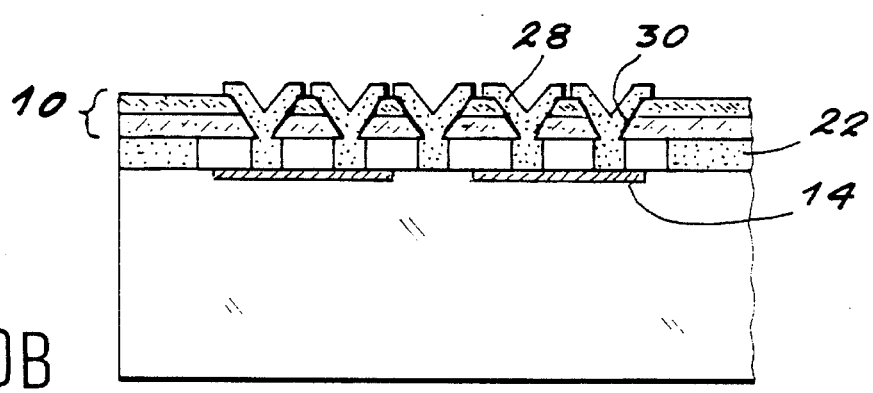

The following stage of the process shown in FIGS. 10A and 10B relates to the resealing of the openings 26 and 30. This resealing takes place whilst maintaining the spaces 16 and 18 under a vacuum in order to obtain an absolute sensor or transducer. In order to achieve this, a vacuum deposition takes place permitting on the one hand the production of hermetic plugs 24 and 28 at the openings 26 and 30 and on the other hand to obtain support studs between the diaphragms 8,10 respectively and the substrate.

These studs make it possible to increase the rigidity of the diaphragm 10 and give the deformable diaphragm 8 a circular deformation which is more favorable for a capacitive detection than a so-called balloon deformation. The studs 26 and 28 are obtained by the deposition on the complete structure of a stack of $SiO_2+Si_3N_4$ deposited by optionally plasma assisted vapor chemical deposition. The thickness of the deposited stack must be approximately 1 μm in order to seal the openings 26 and 30 and form shims between the diaphragms and the substrate.

This is followed by the etching of the stack of layers so as to only retain said stack at the desired locations, i.e. at the openings 26 and 30, so that all parasitic stressing of the diaphragms 8 and 10 is removed.

This is followed by the deposition of a metal layer on the complete structure in order to ensure the interconnections with the measuring circuit, as well as the contacts 32 and 34 on the structures 2 and 4. This metallization has a thickness of approximately 0.5 to 1 μm and can be of aluminium. The layer is then etched to form the contacts 32 and 34 using conventional photolithography processes. Etching of the aluminium can be carried out with the aid of $H_3PO_4$.

This is followed by an etching of the surface silicon on the periphery of the diaphragms 8 and 10 (cf. FIGS. 1 and 3) in order to insulate from one another the measuring and reference structures and reduce parasitic capacitances. This etching can be carried out by reactive ionic etching using $SF_6$.

2) Pressure transducer with piezoresistive detection

Figure 11:
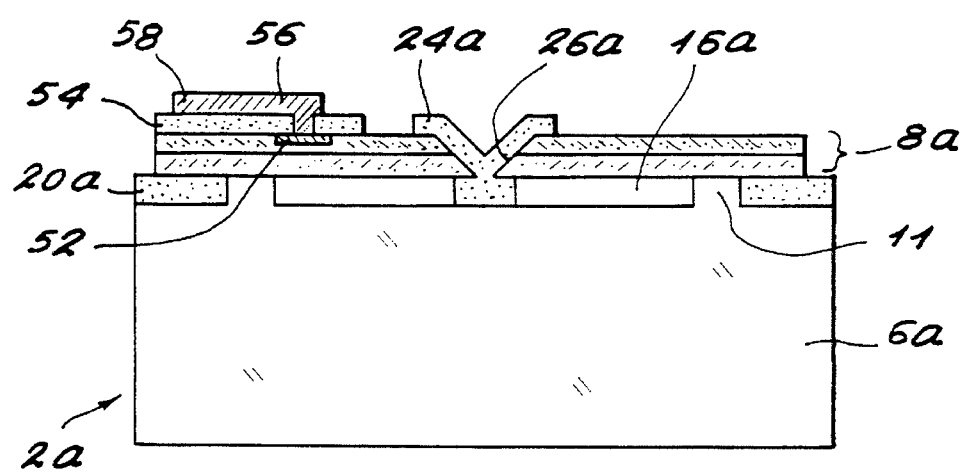
FIG. 11 illustrate diagrammatically and in section a pressure transducer according to the invention with piezoresistive detection.

The pressure transducer according to the invention can, as shown in FIG. 11, also use a piezoresistive detection of the deformations of the deformable diaphragm. The elements fulfilling the same function as those described hereinbefore with reference to FIGS. 1 to 10B will carry the same number followed by the letter a. In addition, the materials and the deposition and etching procedures used for producing said transducer will be the same.

Unlike in the case of the transducer described hereinbefore, piezoresistive detection does not require the use of a reference structure, because it is based on the use of a Wheatstone bridge, which is intrinsically differential.

The sensitive structure 2a of the transducer has a deformable, N type monocrystalline silicon diaphragm 8a separated from the substrate 6a by a space 16a. The diaphragm 8a is joined to the substrate 6a at its periphery by an insulating silica ring 20a and at its centre by the two-layer insulating stud 24a. To this end, the diaphragm 8a has a central opening 26a.

For a piezoresistive detection, the electrical insulation of the diaphragm 8a and the substrate 6a is unnecessary. Thus, as shown in FIG. 11, the diaphragm 8a and the substrate 6a can be in contact with one another via a N doped monocrystalline silicon peripheral ring 11.

In addition, no buried electrode is required. In this case, the shape of the diaphragm 8a is left to the designer. It can be rectangular or circular in the manner described hereinbefore.

The sensitive structure 2a also has a strain gauge 52 formed on the surface of the diaphragm 8a. This strain gauge has a doped zone of the reverse type to that of the layer 8a and in particular of the P type. A silicon dioxide insulator 54 has a contact hole 56 facing the doped area ensuring the electrical contact between a surface metallization 58 and the doped area 52.

The doped area 52 can be in the form of a bar oriented in accordance with a privileged direction for the piezoresistivity, e.g. the direction 110 for an orientation 100 of the film.

This doped area 52 is located on the deformable diaphragm at a maximum stress location, which is dependent on the shape of the diaphragm.

The insulator 54 can be one of those referred to hereinbefore and in particular in the form of a $SiO_2/Si_3N_4$ stack.

In order to reduce the risks of heating of the transducer 2a, it is possible to group four diaphragms 8a in parallel and have a single strain gauge 52 per diaphragm, which is then connected as a Wheatstone bridge. However, it is also possible to use two or more strain gauges for each deformable diaphragm 8a.

The following description relates to the production of the transducer of FIG. 11.

Figure 12:
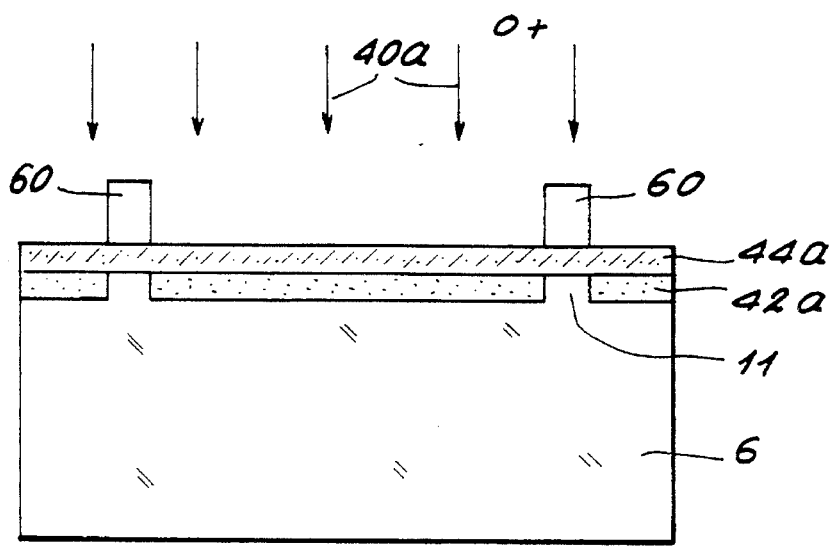
FIGS. 12 to 17 illustrate diagrammatically the different production stages according to the invention for the transducer of FIG. 11.

The first stage shown in FIG. 12 consists of producing the stack of monocrystalline silicon 44a and oxide 42a on the substrate 6 under the same conditions as described relative to FIG. 5. However, the electrical insulation of the diaphragm 8a and the substrate 6a is not necessary and the oxygen implantation 40a can take place in a localized manner.

To this end, a $SiO_2$ mask 60 produced in accordance with standard photolithography methods can be formed on the silicon film 44a masking those areas of the substrate 54 which are to be kept intact.

Figure 13:
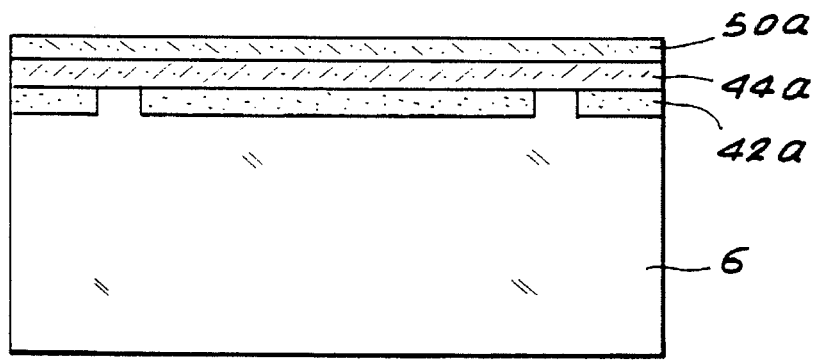

After eliminating the $SiO_2$ mask by chemical etching, as shown in FIG. 13, epitaxial deposition takes place to a N doped monocrystalline silicon layer 50a with a view to producing the strain gauge in the diaphragm 8a. This epitaxial deposition makes it possible to obtain a diaphragm having an adequate rigidity and electrical conductivity in accordance with the sensitivity desired for the pressure transducer. It has a thickness of 1 to 100 μm and typically 5 μm.

Figure 14:
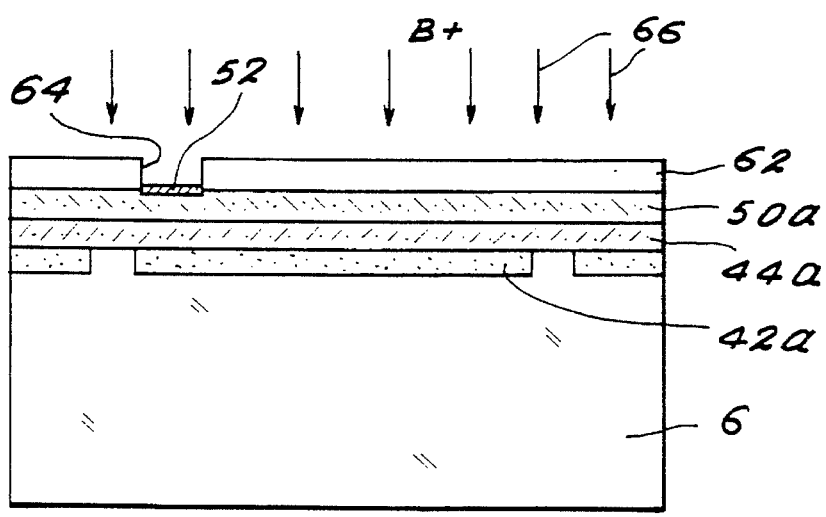

The following stage of the process shown in FIG. 14 relates to the production of the strain gauge. This gauge is produced by implanting P type ions and therefore of the opposite type to that of the surface coating 50a on layer 44a. In addition, said strain gauge must be oriented in directions 110 of the epitaxially deposited silicon 50a for an orientation 100 of the film 32.

Local implantation takes place with the aid of an appropriate mask 62 fixing the location and size of the gauge. In particular, said mask has openings 64 facing the locally implanted silicon dioxide 42a.

The implantation is carried out with boron ions at a dose of $2\times10^{14}$ At/cm$^2$ and an energy of 30 keV. The doped region 52 obtained has a thickness of approximately 0.3 μm and has the shape of a bar oriented in accordance with a radius in the case of a circular diaphragm.

The shape flexibility with regards to the diaphragm 8a permits access to all crystalline directions of the silicon and in particular permits the use of a N type strain gauge. In this case, the epitaxially deposited layer 50a is of the P type.

Figure 15:
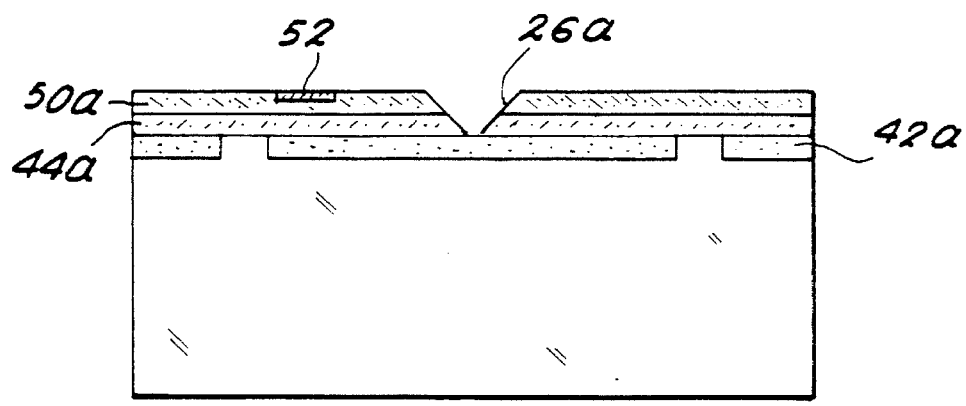

After eliminating the resin mask 62, as shown in FIG. 15, the opening 26a is made in the surface silicon and extends down to the buried insulating layer 42a using the photolithography method. The etching conditions are the same as described hereinbefore so as to obtain an opening 26a with an inclined side.

Figure 16:
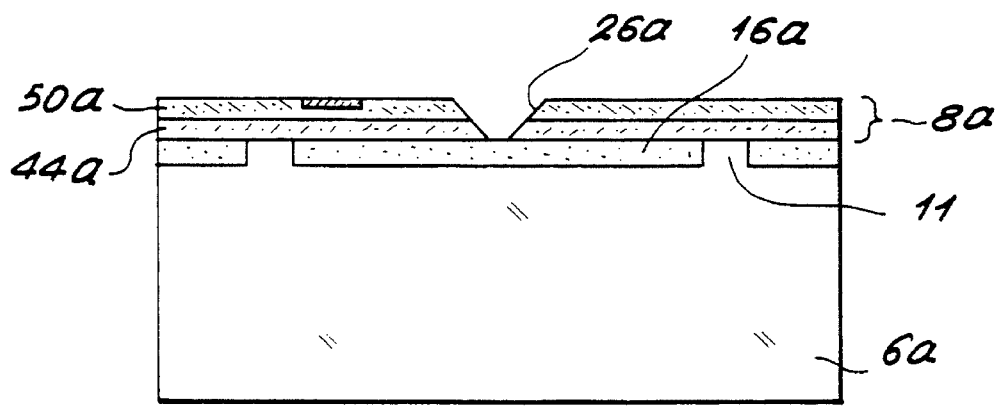

The following stage of the process shown in FIG. 16 consists of freeing the deformable diaphragm 8a by etching the oxide layer with the aid of a hydrofluoric acid-based solution (having a high selectivity relative to silicon). This etching is carried out in the above-described manner via the opening 26a and leads to the elimination of the oxide within the peripheral silicon ring 11. Only the oxide on the outside of the ring 11 is retained.

Thus, the localized implantation of oxygen in the substrate 6a fixes the size of the diaphragm 8a and in particular the space 16a between the diaphragm 8a and the substrate 6a.

Figure 17:
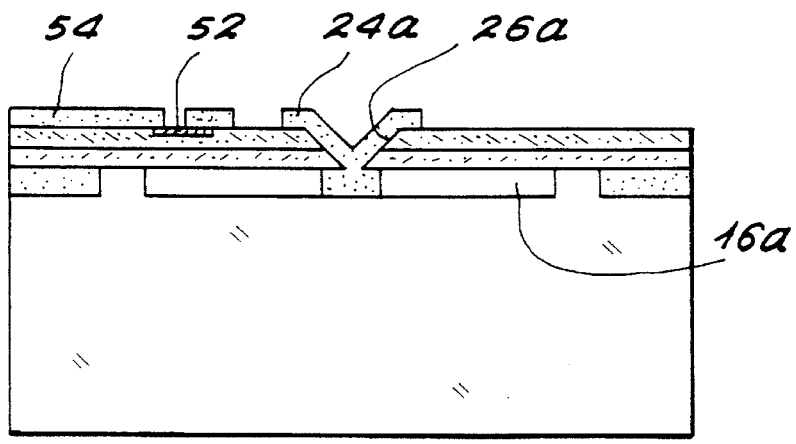

As shown in FIG. 17, this is followed by the vacuum sealing of the opening 26a using a $SiO_2/Si_3N_4$ two-layer insulator, as described hereinbefore. After etching using conventional photolithography processes said insulator leads to the plug 24a on the one hand and to the insulation 54 of the strain gauge 52 on the other. In particular, the etching of the two-layer insulator leads to the formation of the strain gauge contact hole 56.

This is followed by a metallization on the complete aluminium structure and then an etching of said metallization so as to form the electric contacts 58 on the strain gauge 52.

The final stage of the process relates to the peripheral etching of the surface silicon and to that of the insulator 54 remaining on the periphery of the structure (cf. FIG. 11) in order to fix the lateral dimensions of the diaphragm 8a.

We claim:

1. A process for producing an integrated pressure transducer having at least one deformable diaphragm integral with a monocrystalline silicon substrate and means for measuring deformation of the diaphragm, said process comprising the following steps, in sequence, of:

a) implanting oxygen ions in the monocrystalline silicon substrate (6,6a) and annealing the substrate at a temperature about 1150° C. to about 1400° C. in order to form a monocrystalline silicon film (44,44a) on the substrate and separated from the substrate, at least locally, by an insulating layer (42,42a), b) producing an opening (26,26a) in the silicon film down to the insulating layer, c) partially eliminating the insulating layer via said opening in order to form the diaphragm in the silicon film, d) resealing said opening (24,24a), said process also including producing at least one buried electrode contact layer (12,111,113,115) in the silicon substrate facing the deformable diaphragm, said production of said buried electrode contact layer taking place following the annealing of the substrate.

2. A process according to claim 1, wherein the partial elimination of the insulating layer is performed by isotropic chemical etching.

3. A process according to claim 1, wherein a monocrystalline silicon layer (50) is epitaxial or epitaxially deposited on the silicon film before making the opening.

4. A process according to claim 1, wherein the measuring means (52) is at least partly formed in at least one of the silicon film and the epitaxially deposited silicon layers, which are then conductive and electric contacts (32,34,58) are produced on the conductive silicon for said means.

5. A process according to claim 1, wherein the substrate is of N doped monocrystalline silicon.

6. A process according to claim 1, wherein resealing said opening comprises depositing on the complete structure at least one additional layer and etching said additional layer so as to only retain material at location of the opening.

7. A process according to claim 6, wherein a stack of two insulating layers made of silicon dioxide and silicon nitride, respectively are used to reseal the opening.

8. A process according to claim 1, wherein the buried electrode contact layer is formed by local implantation of ions in the substrate with a conductivity type opposite to that of the substrate.

9. A process according to claim 1, wherein the insulating layer (42) is formed over the entire surface of the substrate.

10. A process according to claim 1 wherein the transducer has differential capacitive measuring means, and said process further comprises simultaneous production of a reference structure (4) having a rigid diaphragm (16) integrated onto the substrate, and including the following steps:

producing a conductive silicon film separated from the substrate over its entire surface, producing several openings (26,30) in the silicon film and extending down to the insulating layer, partially eliminating the insulating layer via at least one (26) of said openings, resealing said openings by means of insulating studs (28), producing electric contacts (34) on the conductive silicon film.

11. A process according to claim 10, wherein in the conductive silicon film is produced one of the several openings (26) down to the insulating layer, and the insulating layer is eliminated via said one opening and other openings (30) in the silicon film.

12. A process according to claim 10, wherein at least one buried reference electrode contact layer (14) is formed in the silicon substrate facing the rigid diaphragm (10).

13. A process according to claim 1, and further comprising a peripheral etching of the silicon formed on the insulating layer in order to insulate the diaphragm or diaphragms (8,8a,10).

* * * * *